United States Patent
Kresge et al.

[11] Patent Number: 5,956,235
[45] Date of Patent: Sep. 21, 1999

[54] METHOD AND APPARATUS FOR FLEXIBLY CONNECTING ELECTRONIC DEVICES

[75] Inventors: John S. Kresge, Binghamton; Robin A. Susko, Owego; James W. Wilson, Vestal, all of N.Y.

[73] Assignee: International Business Machines Corporation, Armonk, N.Y.

[21] Appl. No.: 09/022,848

[22] Filed: Feb. 12, 1998

[51] Int. Cl.⁶ ............................................. H01R 9/00
[52] U.S. Cl. .......................... 361/774; 257/737; 361/776
[58] Field of Search ................................. 361/760, 772, 361/773, 774, 776, 767; 439/66, 91; 257/737

[56] References Cited

U.S. PATENT DOCUMENTS

| | | | |
|---|---|---|---|
| 4,064,623 | 12/1977 | Moore | 29/629 |
| 4,413,308 | 11/1983 | Brown | 361/776 |
| 4,811,165 | 3/1989 | Currier | 439/77 |
| 5,060,844 | 10/1991 | Behun et al. | 228/180.2 |
| 5,244,142 | 9/1993 | Nishiguchi et al. | 228/180.22 |
| 5,329,423 | 7/1994 | Scholz | 361/760 |
| 5,431,328 | 7/1995 | Chang et al. | 228/180.22 |
| 5,790,377 | 8/1998 | Schreiber et al. | 361/774 |

OTHER PUBLICATIONS

IBM Technical Disclosure Bulletin, Essert, vol. 7, No. 10, p. 873 Mar. 1965
IBM Technical Disclosure Bulletin; Pressure Contact Type Chip Join Technique; vol.18, No. 9, p. 2817, Feb. 1976.

*Primary Examiner*—Neil Abrams
*Attorney, Agent, or Firm*—Schmeiser, Olsen & Watts; Lawrence R. Fraley

[57] ABSTRACT

A flexible interconnect for flexibly connecting an integrated circuit chip to a substrate. The flexible interconnect includes a flexible core, formed of a polymeric material, fully covered by a layer of an electrically conductive metal. A layer of a compliant material is provided beneath the input/output pad of the substrate and/or integrated circuit chip to reduce mechanical stresses on the flexible interconnect. The substrate and integrated circuit chip may include depressions to receive ends of the flexible interconnect. In one embodiment, the flexible interconnect may be tubular in shape and positioned on a protrusion formed on the substrate.

19 Claims, 3 Drawing Sheets

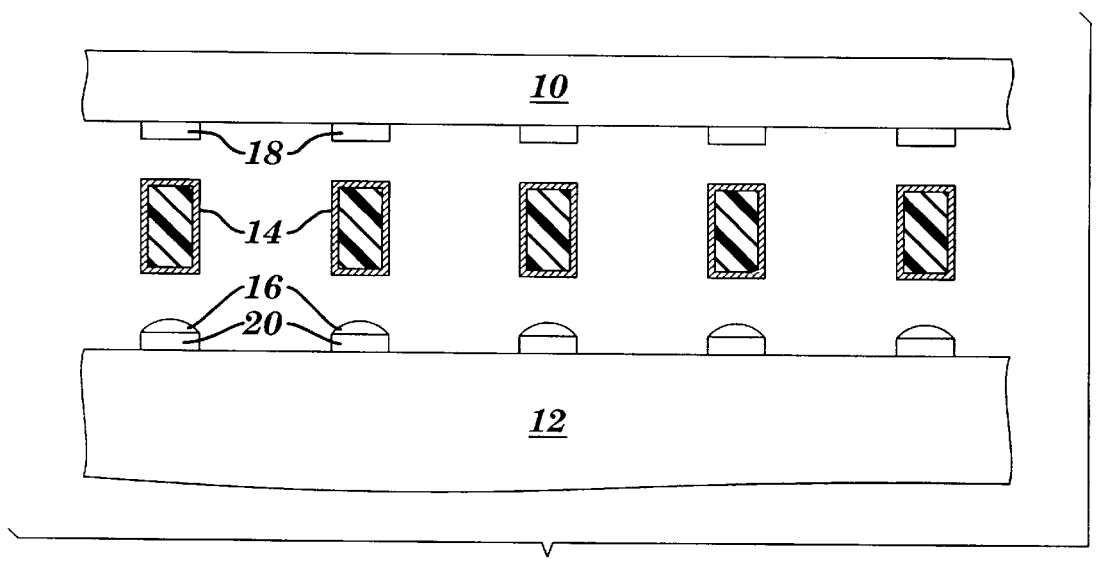
FIG. 1
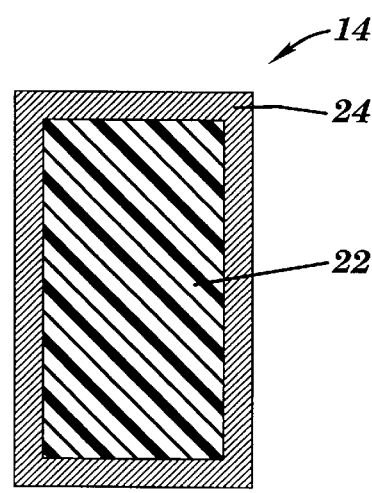
FIG. 2
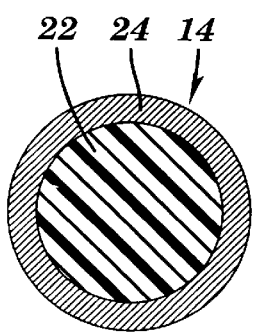 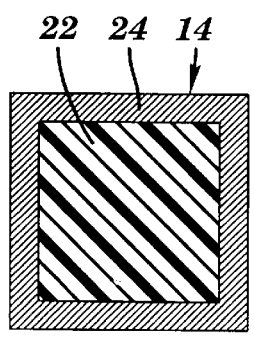 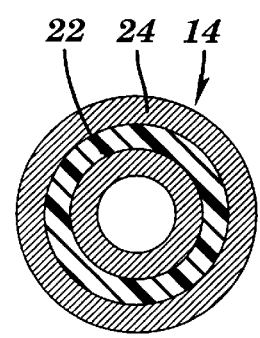
FIG. 3A   FIG. 3B   FIG. 3C

METHOD AND APPARATUS FOR FLEXIBLY CONNECTING ELECTRONIC DEVICES

FIELD OF THE INVENTION

The present invention is in the field of electronic devices. More particularly, the present invention provides a method and apparatus for flexibly connecting an integrated circuit chip to a substrate to substantially eliminate interconnect failure due to mechanical stress and other factors.

BACKGROUND OF THE INVENTION

Flip-chip bonding has long been used to mechanically bond and electrically connect integrated circuit chips to a substrate or other surface. Unfortunately, when an integrated circuit chip formed of a first material such as silicon is attached using prior art flip-chip bonding techniques to a substrate (e.g., an organic laminate chip carrier) formed of a second material having a different coefficient of thermal expansion (CTE), the differing thermal expansion between the integrated circuit chip and the substrate may create high strain and interconnect failure.

SUMMARY OF THE INVENTION

The present invention obviates the deficiencies of the prior art by providing a novel method and apparatus for flexibly connecting an integrated circuit chip to a substrate. A first embodiment of the present invention provides an apparatus for connecting a first electrical component having a first electrically conductive pad to a second electrical component having a second electrically conductive pad, comprising:
- a flexible element fully covered by an electrically conductive coating;
- a compliant material disposed between the second pad and the second electrical component;
- a first electrically conductive material for coupling the flexible element to the first pad; and
- a second electrically conductive material for coupling the flexible element to the second pad.

BRIEF DESCRIPTION OF THE DRAWINGS

The features of the present invention will best be understood from a detailed description of the invention and a preferred embodiment thereof selected for the purposes of illustration and shown in the accompanying drawings in which:

FIG. 1 is an exploded view illustrating the connection of an integrated circuit chip to a substrate, using a flip-chip bonding technique, in accordance with a first embodiment of the present invention;

FIG. 2 is a cross-sectional view of a first embodiment of a flexible interconnect in accordance with the present invention;

FIGS. 3A–3C are cross-sectional plan views of various embodiments of the flexible interconnect;

DETAILED DESCRIPTION OF THE INVENTION

Figure 4:
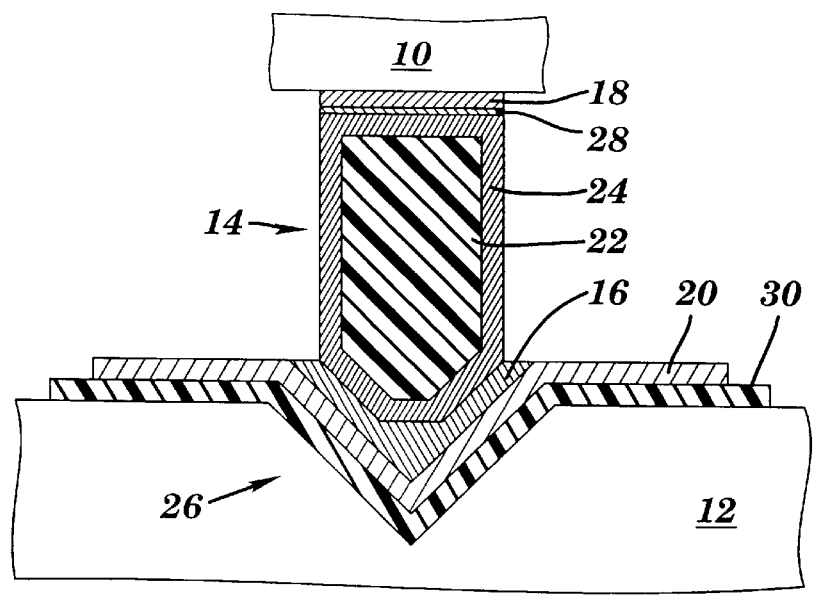
FIG. 4 is a cross-sectional view illustrating a preferred technique for connecting an integrated circuit chip to a substrate using the flexible interconnect of the present invention.

The features and advantages of the present invention are illustrated in detail in the accompanying drawings, wherein like reference numerals refer to like elements throughout the drawings.

Referring first to FIG. 1, there is illustrated the connection of an integrated circuit chip 10 to a substrate 12 using a flip-chip bonding technique. A plurality of flexible interconnects 14, in accordance with a first embodiment of the present invention, are used to flexibly connect the integrated circuit chip 10 to the substrate 12 to substantially eliminate interconnect failure. Each flexible interconnect 14 is attached to the substrate 12 using a ball of solder 16 or other suitable, electrically conductive material. The connection provided by each flexible interconnect 14 forms an electrical path between an electrically conductive input/output pad 18 on the integrated circuit chip 10 and a respective, electrically conductive input/output pad 20 on the substrate 12. Generally, such input/output pads 18, 20 are formed from a metal such as aluminum or copper. In addition, it should be appreciated that input/output pads 18, 20 are joined to other circuitry on their respective substrates by any means known to those of ordinary skill in the art.

A cross-sectional view of a first embodiment of the flexible interconnect 14 is illustrated in detail in FIG. 2. Generally, the flexible interconnect 14 comprises a flexible core 22, which is fully surrounded by a layer 24 of an electrically conductive material, for establishing an electrical connection between the integrated circuit chip 10 and the substrate 12. The flexible core 22 of the flexible interconnect 14 may be formed of a polymeric material such as rubber, silicone, or the like, or other suitable flexible material. The polymeric material may be electrically insulating, or may contain electrically conductive particles, microballs, etc. Preferably, the flexible core 22 is preformed prior to being covered with the layer 24 of an electrically conductive material (e.g., an electrically conductive metal). In the following description of the present invention, the flexible core 22 of the flexible interconnect 14 is fully covered to a thickness of a few microns with an electrically conductive metal such as Cu, Ni, Au, or combination thereof. Any method known in the art, such as plating or sputtering, may be used to cover the flexible core 22 with the layer 24 of metal.

The flexible interconnect 14 may be formed in a wide variety of configurations. For example, as illustrated in FIG. 3A, the flexible interconnect 14 may comprise a solid column having a circular cross-section. Alternately, as shown in FIG. 3B the flexible interconnect 14 may have a polygonal cross-section. Further, the flexible interconnect 14 may be tubular as illustrated in FIG. 3C. Of course, the flexible interconnect 14 may be formed in many other configurations without departing from the intended scope of the present invention.

A first, preferred technique for connecting the integrated circuit 10 to the substrate 12 using the flexible interconnect 14 of the present invention is illustrated in FIG. 4. In this example, the substrate 12 includes a depression 26 configured to receive an end of the flexible interconnect 14 therein.

A first end of the flexible interconnect 14 is secured to an input/output pad 18 of the integrated circuit chip 10 using a layer 28 of solder. Alternately, the layer 28 may comprise an electrically conductive adhesive (e.g., epoxy). The opposing end of the flexible interconnect 14 is positioned within the depression 26 formed in the substrate 12. Solder 16, or a layer of an electrically conductive adhesive, is used to connect the end of the flexible interconnect 14 to the input/output pad 20 of the substrate 12. The solder 16 fills in any remaining space in the depression 26 around the end of the flexible interconnect 14. As illustrated in FIG. 4, the end of the flexible interconnect may be beveled to conform to the shape of the depression 26.

A layer 30 of a compliant material may be located between the input/output pad 20 and the surface of the substrate 12. The compliant layer 30 may, for example, be formed of a polymeric material such as rubber or silicone, or other suitable compliant material. As shown in FIG. 4, both the compliant layer 30 and the input/output pad 20 follow the contour of, and fully cover, the depression 26 in the substrate 12. Preferably, the compliant layer 30 completely underlays the input/output pad 20, and extends beyond the edges of the depression 26. Advantageously, the compliant layer 30 reduces mechanical stresses on the flexible interconnect 14 caused by the relative lateral displacement of the integrated circuit chip 10 and substrate 12 due to differences in their coefficients of thermal expansion.

Figure 5:
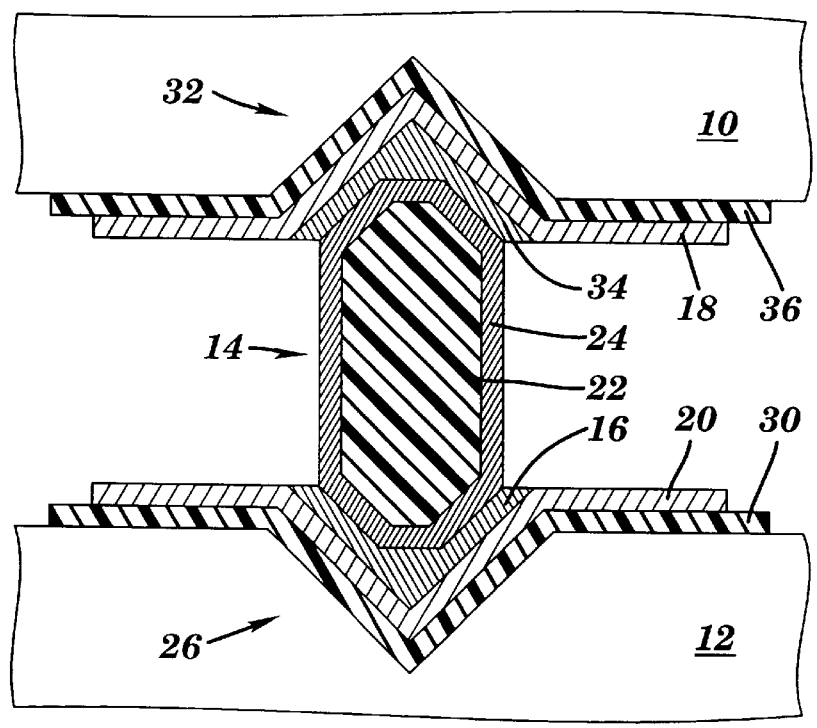
FIG. 5 is a cross-sectional view illustrating an alternate technique for connecting an integrated circuit chip to a substrate using the flexible interconnect of the present invention.

A similar depression 32 may also be formed in the integrated circuit chip 10 as illustrated in FIG. 5. The depression 32 may be used in combination with, or in lieu of, the depression 26 formed in the substrate 12 (FIG. 4). In this embodiment, the first end of the flexible interconnect 14 is positioned within the depression 32 and is secured to the input/output pad 18 using solder 34 or an electrically conductive adhesive. Again, the solder 34 fills in any remaining space in the depression 32 around the end of the flexible interconnect 14.

An additional layer 36 of a compliant material may be positioned between the surface of the integrated circuit chip 10 and the input/output pad 18. The compliant layer 36 and the input/output pad 18 follow the contour of, and fully cover, the depression 32 in the integrated circuit chip 10. The compliant layer 36 completely underlays the input/output pad 18, and extends beyond the edges of the depression 32.

Figure 6:
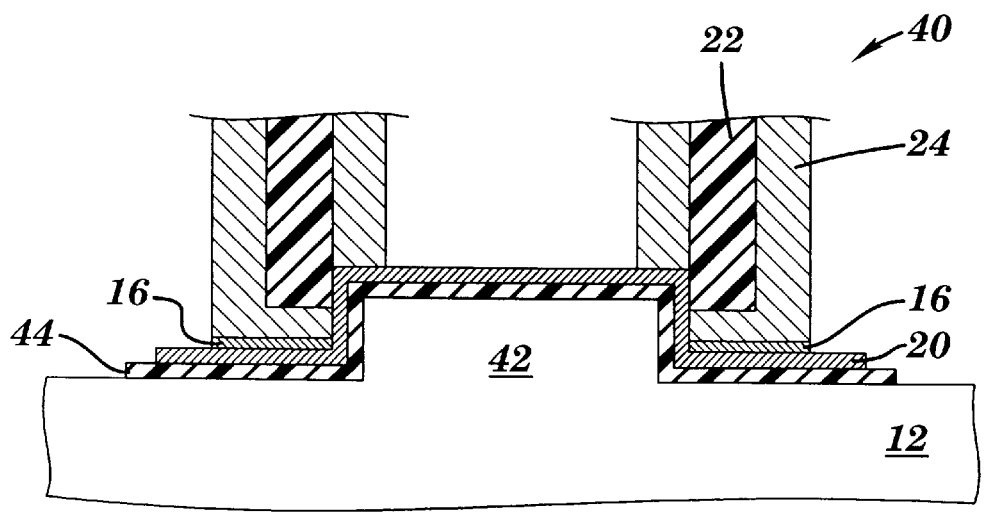
FIG. 6 is a cross-sectional view illustrating the connection of a flexible interconnect having a tubular configuration to a substrate in accordance with another embodiment of the present invention.

Another embodiment of the present invention, wherein a flexible interconnect, having a tubular configuration such as that previously described with regard to FIG. 3C, is used to flexibly interconnect the integrated circuit chip 10 to the substrate 12, is illustrated in FIG. 6. In this embodiment, an end of a tubular flexible interconnect 40 is positioned on a protrusion 42 formed on the surface of the substrate 12. Although described below with regard to the substrate 12 only, it should be clear that a similar technique may be used to connect and secure an end of the tubular flexible interconnect 40 to the integrated circuit chip 10.

The tubular flexible interconnect 40 is secured to the input/output pad 20 of the substrate 12 using solder 16 or an electrically conductive adhesive. Specifically, the solder 16 is positioned between the layer 24 of electrically conductive material on the tubular flexible interconnect 40 and the input/output pad 20. In the example shown in FIG. 6, the layer 24 of electrically conductive material is shown extending around the end of the flexible core 22. However, it should be noted that the entire exterior and interior of flexible core 22 may be covered with the layer 24 of electrically conductive material.

The input/output pad 20 is configured to follow the contour of, and fully cover, the protrusion 42. A layer 44 of a compliant material may again be positioned between the surface of the substrate 12 and the input/output pad 20. As previously described, the compliant layer 44 reduces mechanical stresses on the flexible interconnect 10 caused by the relative lateral displacement of the substrate 12 and integrated circuit chip 10 due to differences in their coefficients of thermal expansion.

Figure 7:
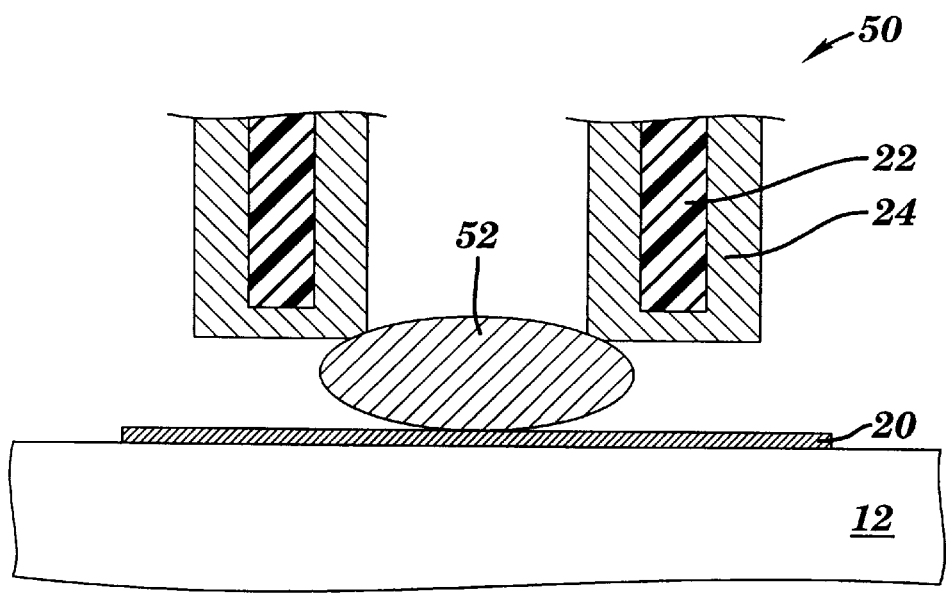
FIG. 7 is a cross-sectional view of an alternate technique for connecting the tubular flexible interconnect of FIG. 6 to the substrate.

In yet another alternate embodiment of the present invention, illustrated in FIG. 7, a tubular flexible interconnect 50 may be positioned directly over a ball of solder 52 to connect it to an input/output pad 20 on the substrate 12 using a flip-chip bonding technique. In this embodiment, the ball of solder 52 acts in a manner similar to that of the protrusion 42 shown in FIG. 6. A layer of a compliant material (not shown) may again be positioned between the input/output pad 20 and the surface o:f the substrate 12.

The foregoing description of the present invention has been presented for purposes of illustration and description. It is not intended to be exhaustive or to limit the invention to the precise form disclosed, and many modifications and variations are possible in light of the above teaching. Such modifications and variations that may be apparent to a person skilled in the art are intended to be included within the scope of this invention as defined by the accompanying claims.

We claim:

1. An apparatus for connecting a first electrical component having a first electrically conductive pad to a second electrical component having a depression therein, comprising:

a flexible interconnect comprising a flexible element fully covered by an electrically conductive coating, wherein an end of the flexible interconnect extends into the depression;

a compliant material disposed within the depression and conforming to a surface thereof, wherein the compliant material overlays and directly contacts the second electrical component;

a second electrically conductive pad overlaying and directly contacting the compliant material; and an electrically conductive material overlaying and directly contacting the second electrically conductive pad for coupling the end of the flexible interconnect directly to the second pad, wherein the depression is completely filled by the compliant material, the second electrically conductive pad, and the electrically conductive material.

2. The apparatus according to claim 1, wherein the flexible element is formed of a polymeric material.

3. The apparatus according to claim 1, wherein the compliant material comprises a polymeric material.

4. The apparatus according to claim 1, wherein the compliant material completely underlays the second pad.

5. The apparatus according to claim 1, wherein the flexible element has a circular cross-section.

6. The apparatus according to claim 1, wherein the flexible element has a polygonal cross-section.

7. The apparatus according to claim 1, wherein the flexible element is tubular.

8. The apparatus according to claim 1, wherein the flexible element is formed of an electrically conductive polymeric material.

9. The apparatus according to claim 1, wherein the first pad and an opposing end of the flexible element are disposed within a depression on the first electrical component.

10. The apparatus according to claim 9, wherein a layer of the compliant material, disposed between the first pad and the first electrical component, fully covers a surface of the depression in the first electrical component.

11. The apparatus according to claim 9, wherein the first pad fully covers a surface of the depression.

12. The apparatus according to claim 9, wherein any remaining space in the depression in the first electrical component around the opposing end of the flexible element is completely filled by a conductive material.

13. The apparatus according to claim 1, wherein the flexible interconnect is tubular, and wherein at least one of the first and the second electrical components includes a protuberance for receiving an end of the flexible interconnect thereon.

14. The apparatus according to claim 13 wherein the protuberance is covered by a layer of the compliant material.

15. The apparatus according to claim 1, wherein the electrically conductive coating covering the flexible element is an electrically conductive metal.

16. A method for connecting a first electrical component to a second electrical component, comprising the steps of:

providing an electrical component having a first depression therein;

providing a compliant layer that overlays and directly contacts the first electrical component and conforms to a surface of the depression;

providing an electrically conductive pad within the depression, wherein the pad overlays and directly contacts the compliant layer;

providing an electrically conductive material within the depression, wherein the material overlays and directly contacts the electrically conductive pad within the depression; and providing a flexible interconnect comprising a flexible element fully covered by an electrically conductive coating, wherein an end of the flexible interconnect extends into the depression and directly contacts the electrically conductive material.

17. An apparatus, comprising:

an electrical component having a depression therein;

a compliant layer overlaying and directly contacting the electrical component and conforming to a surface of the depression;

an electrically conductive pad, disposed within the depression, wherein the pad overlays and directly contacts the compliant layer;

an electrically conductive material, disposed within the depression, wherein the material overlays and directly contacts the electrically conductive pad; and a flexible interconnect comprising a flexible element fully covered by an electrically conductive coating, wherein an end of the flexible interconnect extends into the depression and directly contacts the electrically conductive material.

18. An apparatus for connecting a first electrical component having a first depression therein to a second electrical component having a second depression therein, comprising:

a first electrically conductive pad attached to the first electrical component, and positioned in the first depression;

a second electrically conductive pad attached to the second electrical component, and positioned in the second depression;

a flexible interconnect comprising a flexible element fully covered by an electrically conductive coating, wherein opposing ends of the flexible interconnect extend into the first and second depressions;

a first compliant material disposed between the first pad and the first electrical component, and positioned in the first depression;

a second compliant material disposed between the second pad and the second electrical component, and positioned in the second depression;

a first electrically conductive material, disposed in the first depression, for coupling the flexible interconnect to the first pad, wherein the first depression is completely filled by the first pad, the first compliant material, and the first electrically conductive material; and a second electrically conductive material, disposed in the second depression, for coupling the flexible interconnect to the second pad, wherein the second depression is completely filled by the second pad, the second compliant material, and the second electrically conductive material.

19. An apparatus, comprising an electrical component including a protuberance;

a compliant layer overlaying and directly contacting the electrical component, wherein the compliant layer conforms to a surface of the protuberance;

an electrically conductive pad, wherein the pad overlays and directly contacts the compliant layer;

an electrically conductive material, wherein the material overlays and directly contacts the electrically conductive pad; and a flexible interconnect comprising a flexible element fully covered by an electrically conductive coating, wherein an end of the flexible interconnect overlays and directly contacts the electrically conductive material.

* * * * *